United States Patent
Seo et al.

(10) Patent No.: US 10,448,521 B2
(45) Date of Patent: Oct. 15, 2019

(54) ROLLABLE DISPLAY DEVICE

(71) Applicant: SAMSUNG DISPLAY CO., LTD., Yongin-si, Gyeonggi-do (KR)

(72) Inventors: Tae An Seo, Hwaseong-si (KR); Min-Sung Kim, Hwaseong-si (KR); Jung Hun Lee, Hwaseong-si (KR); Jin Hwan Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/642,803

(22) Filed: Jul. 6, 2017

(65) Prior Publication Data

US 2018/0014417 A1    Jan. 11, 2018

(30) Foreign Application Priority Data

Jul. 7, 2016    (KR) .................. 10-2016-0086185

(51) Int. Cl.
| | |
|---|---|
| *H05K 5/00* | (2006.01) |
| *H05K 1/02* | (2006.01) |
| *H05K 1/14* | (2006.01) |
| *H05K 1/18* | (2006.01) |
| *H05K 5/02* | (2006.01) |

(Continued)

(52) U.S. Cl.
CPC ............. *H05K 5/0017* (2013.01); *G02F 1/13* (2013.01); *H05K 1/0203* (2013.01); *H05K 1/0281* (2013.01); *H05K 1/144* (2013.01); *H05K 1/181* (2013.01); *H05K 1/189* (2013.01); *H05K 5/0217* (2013.01); *H05K 7/20954* (2013.01); *H05K 2201/041* (2013.01); *H05K 2201/056* (2013.01); *H05K 2201/10128* (2013.01)

(58) Field of Classification Search
CPC .... G02F 1/133305; G02F 1/13; G06F 1/1652; H05K 5/0217; H05K 1/141; H05K 5/0017; H05K 1/028; H05K 1/0393; H05K 1/144; H05K 1/181; H05K 1/189; H05K 7/20954; H05K 1/0281; H05K 1/0203; H05K 2201/056; H05K 2201/10128; H05K 2201/041
See application file for complete search history.

(56) References Cited

U.S. PATENT DOCUMENTS

| | | | |
|---|---|---|---|
| 8,151,501 B2 * | 4/2012 | Bemelmans | G06F 1/1601 |
| | | | 40/603 |
| 8,953,327 B1 * | 2/2015 | Salmon | G06F 1/1652 |
| | | | 160/242 |

(Continued)

FOREIGN PATENT DOCUMENTS

| | | |
|---|---|---|
| KR | 10-2014-0059274 A | 5/2014 |
| KR | 10-1570869 B1 | 11/2015 |
| KR | 10-2016-0047100 A | 5/2016 |

*Primary Examiner* — Adam B Dravininkas
(74) *Attorney, Agent, or Firm* — Lewis Roca Rothgerber Christie LLP (57) ABSTRACT

A rollable display device includes: a rollable display including a first end and a second end spaced apart from the first end; a first slider including a roller that supports the first end of the rollable display, the first slider being configured to roll the rollable display about the roller; and a second slider including a support that supports the second end of the rollable display while bending the second end of the rollable display, the second slider being slideable relative to the first slider.

13 Claims, 7 Drawing Sheets

(51) Int. Cl.
*H05K 7/20* (2006.01)
*G02F 1/13* (2006.01)

(56) References Cited

U.S. PATENT DOCUMENTS

| | | | |
|---|---|---|---|
| 9,111,470 B2* | 8/2015 | Anderson | G09F 9/301 |
| 9,609,225 B2* | 3/2017 | Kwon | G06F 3/04845 |
| 10,082,826 B1* | 9/2018 | Salmon | G09F 9/301 |
| 2006/0166713 A1* | 7/2006 | Yeh | G06F 1/1626 |
| | | | 455/575.1 |
| 2007/0146243 A1* | 6/2007 | Ou Yang | G06F 1/1601 |
| | | | 345/76 |
| 2010/0182738 A1* | 7/2010 | Visser | G06F 1/1613 |
| | | | 361/679.01 |
| 2010/0246113 A1* | 9/2010 | Visser | G06F 1/1601 |
| | | | 361/679.3 |
| 2012/0204453 A1* | 8/2012 | Jung | G09F 9/301 |
| | | | 40/517 |
| 2012/0212433 A1* | 8/2012 | Lee | G06F 1/1652 |
| | | | 345/173 |
| 2013/0058063 A1 | 3/2013 | O'Brien | |
| 2016/0100478 A1* | 4/2016 | Lee | H04M 1/0202 |
| | | | 361/749 |
| 2016/0170450 A1* | 6/2016 | Kim | G06F 1/1652 |
| | | | 361/807 |

* cited by examiner

ROLLABLE DISPLAY DEVICE

CROSS-REFERENCE TO RELATED APPLICATION

This application claims priority to and the benefit of Korean Patent Application No. 10-2016-0086185, filed on Jul. 7, 2016 in the Korean Intellectual Property Office, the entire content of which is incorporated herein by reference.

BACKGROUND

1. Field

Aspects of one or more embodiments relate to a rollable display device.

2. Description of the Related Art

A display device is a device displaying an image, and, recently, an organic light emitting diode display has received attention.

A rollable display device is a device that includes a rollable display being rolled on or unrolled from a roller. The rollable display can be portable by reducing the overall size of the rollable display by rolling the rollable display on the roller.

The above information disclosed in this Background section is only for enhancement of understanding of the background of the described technology and therefore it may contain information that does not form the prior art that is already known in this country to a person of ordinary skill in the art.

SUMMARY

According to an aspect of one or more embodiments, in a rollable display device, stability of a rollable display is improved when the rollable display is rolled on a roller or unrolled from the roller.

According to one or more embodiments, a rollable display device includes: a rollable display including a first end and a second end spaced apart from the first end; a first slider including a roller that supports the first end of the rollable display, the first slider being configured to roll the rollable display about the roller; and a second slider including a support that supports the second end of the rollable display while bending the second end of the rollable display, the second slider being slideable relative to the first slider.

The rollable display device may further include: a printed circuit board that is arranged in the second slider and corresponding to a bottom side of the rollable display; and a flexible printed circuit arranged in the support and connecting between the printed circuit board and the second end of the rollable display.

The flexible printed circuit may include: a chip opposing the bottom side of the rollable display; and a heat dissipating portion surrounding the chip.

The second slider may further include a reinforcing portion between the support and the flexible printed circuit.

The second slider may be sliceable in the first slider.

The rollable display device may further include a third slider between the first slider and the second slider, wherein the second slider may be slideable in the third slider and the third slider may be slideable in the first slider.

The flexible printed circuit may be bent in a plurality of directions.

The first slider may be slideable in the second slider.

The rollable display device may further include a fourth slider between the first slider and the second slider, wherein the first slider may be slideable in the fourth slider and the fourth slider may be slideable in the second slider.

The flexible printed circuit may be bent along an interior wall of the support.

The support may include a curved interior wall.

The rollable display device may further include at least one elastic member between the first slider and the second slider.

According to an exemplary embodiment, in the rollable display device, stability of the rollable display is improved when the rollable display is rolled on a roller or unrolled from the roller.

DETAILED DESCRIPTION

The present invention will be described more fully hereinafter with reference to the accompanying drawings, in which some exemplary embodiments of the present invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

In addition, the size and thickness of each configuration shown in the drawings may be arbitrarily shown for better understanding and ease of description, but the present invention is not limited thereto. In the drawings, the thicknesses of layers, films, panels, regions, etc., may be exaggerated for clarity.

Further, it will be understood that when an element is referred to as being "on" another element, it can be directly on the other element or intervening elements may also be present. In contrast, when an element is referred to as being "directly on" another element, there are no intervening elements present. Throughout the specification, the word "on" means positioning on or below the object portion, but does not necessarily mean positioning on the upper side of the object portion based on a gravitational direction.

In addition, unless explicitly described to the contrary, the word "comprise" and variations, such as "comprises" or "comprising," will be understood to imply the inclusion of stated elements but not the exclusion of any other elements.

A rollable display device according to an exemplary embodiment will be described with reference to FIG. 1 to FIG. 4.

Figure 1:
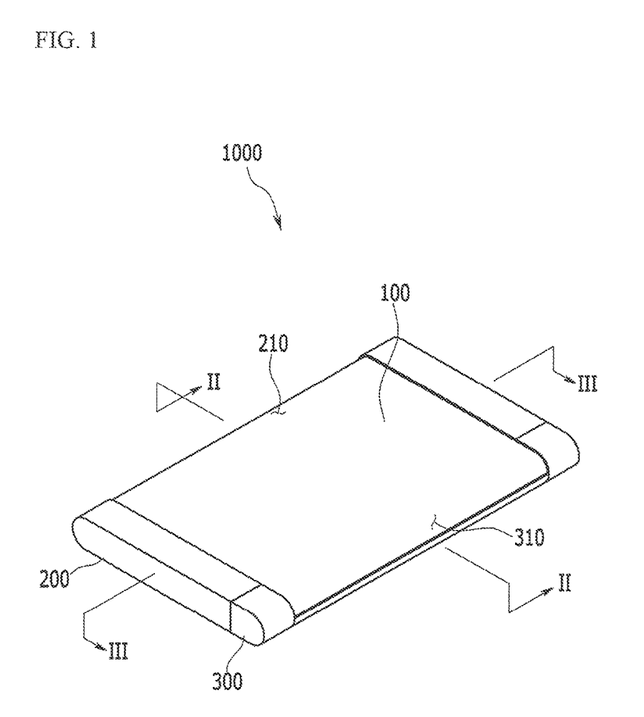
FIG. 1 is a perspective view of a rollable display device according to an exemplary embodiment.
Figure 2:
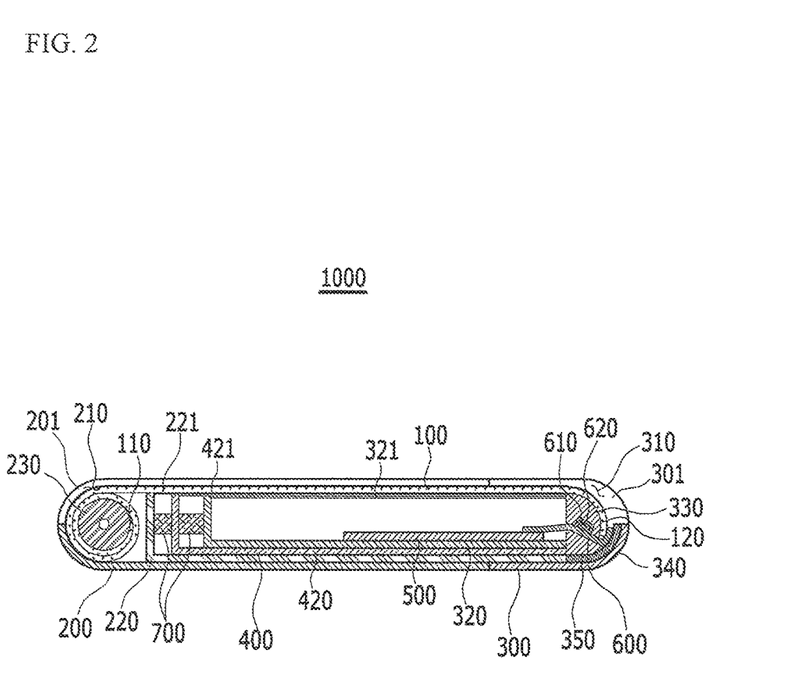
FIG. 2 is a cross-sectional view of the rollable display device of FIG. 1, taken along the line II-II.
Figure 3:
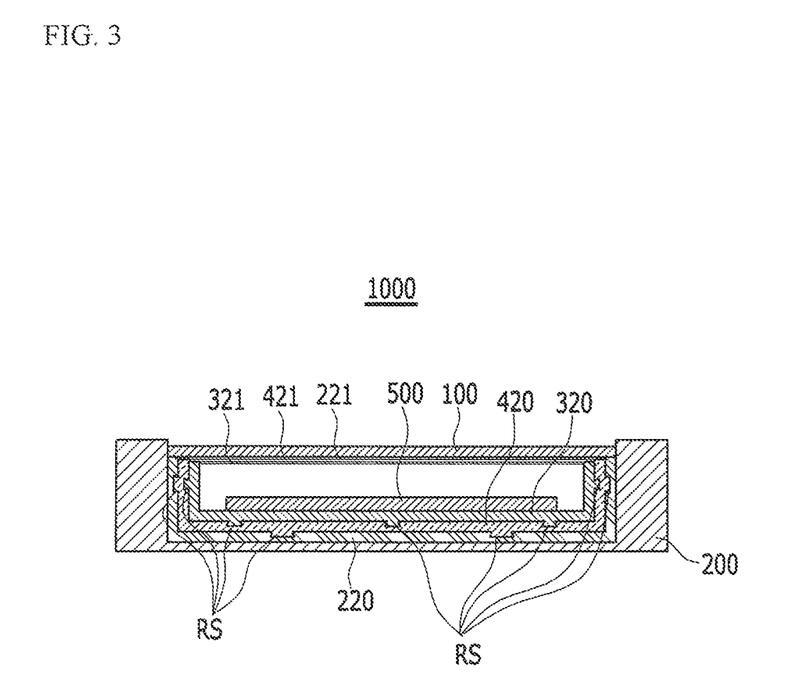
FIG. 3 is a cross-sectional view of the rollable display device of FIG. 1, taken along the line III-III.

FIG. 1 is a perspective view of a rollable display device according to an exemplary embodiment. FIG. 2 is a cross-sectional view of the rollable display device of FIG. 1, taken along the line II-II. FIG. 3 is a cross-sectional view of the rollable display device of FIG. 1, taken along the line III-III.

FIG. 1 to FIG. 3 show a rollable display device in a state in which a rollable display of the rollable display device is wound on a roller.

As shown in FIG. 1 to FIG. 3, a rollable display device 1000 includes a rollable display 100, a first slider 200, a second slider 300, a third slider 400, a printed circuit board (PCB) 500, a flexible printed circuit (FPC) 600, and an elastic member 700.

The rollable display 100 displays an image. The rollable display 100 may be rolled on a roller 230 of the first slider 200 or unrolled from the roller 230. The rollable display 100 may include a flexible substrate or a film that is disposed opposite the rollable display 100, interposing at least one of liquid crystal, an organic light emitting diode, electronic ink, and the like. The rollable display 100 may be a transparent or light-transmissive type of display which enables viewing to the outside through the rollable display 100. A touch sensor that senses a touch operation may be located as a touch film, a touch sheet, or a touch panel at a front side of the rollable display 100.

The rollable display 100 includes a first end 110 and a second end 120 that is disposed or spaced apart from the first end 110. The first end 110 of the rollable display 100 is supported by the roller 230 of the first slider 200, and the second end 120 of the rollable display 100 is supported by a support 340 of the second slider 300.

The first slider 200 is provided at a bottom side of the rollable display 100 and supports the bottom side of the rollable display 100. The first slider 200 slides against or relative to the third slider 400 and the second slider 300. The third slider 400 and the second slider 300 may slide into the first slider 200.

The first slider 200 includes a first opening 210, a first sliding portion 220, and the roller 230.

The first opening 210 opens an upper side of the rollable display 100. A first side 201 of the first slider 200, which forms the first opening 210, has a curved shape, and, thus, the upper side of the rollable display 100, supported by the roller 230, is opened while being curved.

The first sliding portion 220 is provided at a bottom side of the rollable display 100, and supports the bottom side of the rollable display 100. The first sliding portion 220 neighbors the roller 230. The first sliding portion 220 includes a first upper portion 221 that opposes the bottom side of the rollable display 100. In an embodiment, the first upper portion 221 of the first sliding portion 220 has a thickness that is thin compared to other portions of the first sliding portion 220. The first upper portion 221 supports the rollable display 100.

The roller 230 is equipped in the first slider 200, and supports the first end 110 of the rollable display 100.

The roller 230 may wind or unwind the rollable display 110 by rotating in the clockwise direction or the counterclockwise direction.

The upper side of the rollable display 110, opened by the first opening 210 by the roller 230, maintains the bent shape.

The second slider 300 slides against or relative to the first slider 200. The second slider 300 may slide into the first slider 200. The printed circuit board 500 is provided in the second slider 300, and the printed circuit board 500 is connected with the rollable display 100 through the flexible printed circuit 600. In an embodiment, the second slider 300 includes a second opening 310, a second sliding portion 320, a curved shape maintaining portion 330, the support 340, and a reinforcing portion 350.

The second opening 310 opens the upper side of the rollable display 100. A second side 301 of the second slider 300, which forms the second opening 310, has a curved shape, and, thus, the upper side of the rollable display 100, supported by the support 340, is opened while being curved.

The second sliding portion 320 is provided at the bottom side of the reliable display 100, and supports the bottom side of the rollable display 100. The second sliding portion 320 neighbors the support 340. The second sliding portion 320 includes a second upper portion 321 that opposes the bottom side of the rollable display 100. In an embodiment, the second upper portion 321 of the second sliding portion 320 has a thickness that is thin compared to other portions of the second sliding portion 320. The second upper portion 321 supports the rollable display 100. The second sliding portion 320 may slide into the first sliding portion 220. The printed circuit board 500 is provided in the second sliding portion 320, and the printed circuit board 500 is connected with the rollable display 100 through the flexible printed circuit 600.

The curved shape maintaining portion 330 is disposed between the sliding portion 320 and the support 340 corresponding to the bottom side of the rollable display 100. The curved shape maintaining portion 330 includes a curved surface, and the curved surface contacts the bottom side of the rollable display 100. The upper side of the rollable display 100, opened by the second opening 310 by the curved shape maintaining portion 330, maintains a bent shape.

The support 340 supports the second end 120 of the rollable display 100 by bending the second end 120. The flexible printed circuit 600 that is disposed between the second end 120 of the rollable display 100 and the printed circuit board 500 is provided in the support 340. The support 340 includes a curved interior wall, and the reinforcing portion 350 is attached to the interior wall.

The reinforcing portion 350 is disposed between the support 340 and the flexible printed circuit 600. The reinforcing portion 350 may be attached to the interior wall of the support 340. The reinforcing portion 350 suppresses interference of the flexible printed circuit 600, which may be caused by the support 340.

The third slider 400 connects between the first slider 200 and the second slider 300. In an embodiment, the third slider 400 slides into the first slider 200, and the second slider 300 slides into the third slider 400. That is, the second slider 300 may slide together with the third slider 400 into the first slider 200.

The third slider 400 includes a third sliding portion 420.

The third sliding portion 420 is provided at the bottom side of the rollable display 100, and supports the bottom side of the rollable display 100. The third sliding portion 420 is disposed between the first sliding portion 220 and the second sliding portion 320. The third sliding portion 420 includes a third upper portion 421 that opposes the bottom side of the rollable display 100. In an embodiment, the third upper portion 421 of the third sliding portion 420 has a thickness that is thin compared to other portions of the third sliding portion 420. The third upper portion 421 supports the rollable display 100. The third sliding portion 420 connects between the first sliding portion 220 and the second sliding portion 320. In an embodiment, the third sliding portion 420 slides into the first sliding portion 220, and the second sliding portion 320 slides into the third sliding portion 420. That is, the second sliding portion 320 may slide together with the third sliding portion 420 into the first sliding portion 220.

In an embodiment, at least one of a connection between the first sliding portion 220 and the third sliding portion 420 and a connection between the third sliding portion 420 and the second sliding portion 320 may have a rail structure RS (e.g., an engraved or embossed rail structure). Such a rail structure RS causes the second sliding, portion 320 to be slide-guided to the first sliding portion 220 together with the third sliding portion 420 to thus be slideable into the first sliding portion 220.

The printed circuit board 500 is provided in the second sliding portion 320 that is disposed in the second slider 300, corresponding to the bottom side of the rollable display 100. The printed circuit board 500 may include a substrate where a circuit is printed and a plurality of chips that are mounted to the substrate. The printed circuit board 500 is connected with the rollable display 100 through the flexible printed circuit 600.

The flexible printed circuit 600 is provided in the support 340. The flexible printed circuit 600 connects between the printed circuit board 500 and the second end 120 of the rollable display 100. In an embodiment, the flexible printed circuit 600 includes a chip 610 that opposes the bottom side of the rollable display 100 and a heat dissipation portion 620 that surrounds the chip 610. The chip 610 of the flexible printed circuit 600 may be connected to the flexible printed circuit 600 in a form of a chip on film (COF). In an embodiment, the flexible printed circuit 600 is bent several times in different directions to connect between the second end 120 of the rollable display 100 and the printed circuit board 500. The flexible printed circuit 600 extends into the second sliding portion 320 while penetrating the curved shape maintaining portion 330 from the support 340 of the second slider 300. The flexible printed circuit 600 is supported by the curved shape maintaining portion 330.

The elastic member 700 is provided between the first sliding portion 220 and the third sliding portion 420 and between the third sliding portion 420 and the second sliding portion 320. The elastic member 700 may generate an elastic force or an elastic restoring force in a direction in which the first sliding portion 220 and the third sliding portion 420 move away from each other and a direction in which the third sliding portion 420 and the second sliding portion 320 move away from each other. The elastic member 700 may include a spring or a shock absorber, or any other suitable device, as long as it can generate the elastic force or elastic restoring force. The elastic force or elastic restoring force generated from the elastic member 700 that is disposed between the first sliding portion 220 and the third sliding portion 420 may be stronger than that generated from the elastic member 700 that is disposed between the third sliding portion 420 and the second sliding portion 320.

In an embodiment, the elastic member 700 disposed between the first sliding portion 220 and the third sliding portion 420 generates stronger elastic force or elastic restoring force compared to the elastic member 700 disposed between the third sliding portion 420 and the second sliding portion 320, such that the third sliding portion 420 slides first in a direction away from the first sliding portion 220, and then the second sliding portion 320 slides in a direction away from the third sliding portion 420. At least one elastic member 700 may be provided between the first slider 200 and the second slider 300.

Herein, referring to FIG. 4, the rollable display 100 that is unrolled from the roller 230 in the rollable display device 1000 according to the exemplary embodiment will be described.

Figure 4:
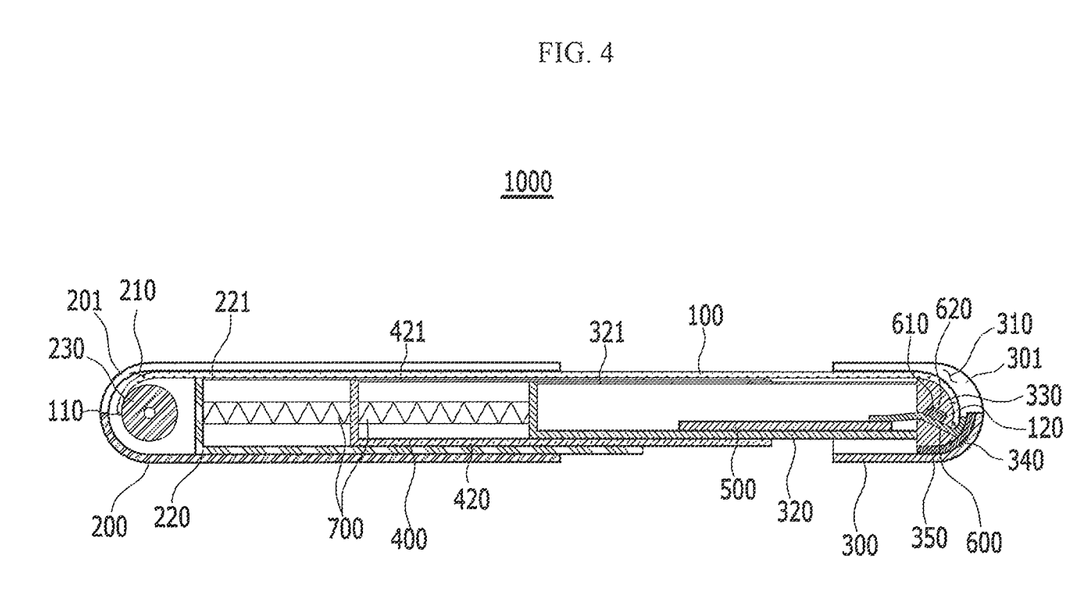
FIG. 4 is a cross-sectional view of the rollable display device of FIG. 2, shown in a state in which a rollable display of the rollable display device is unrolled from a roller.

FIG. 4 is a cross-sectional view of the rollable display 100, shown in a state of being unrolled from the roller 230 of the rollable display device 1000 of FIG. 2.

As shown in FIG. 4, when the second slider 300 slides with the third slider 400 in the direction away from the first slider 200 by the elastic force or elastic restoring force of the elastic member 700, the rollable display 100 is unrolled from the roller 230.

As the rollable display 100 is unrolled from the roller 230, a display area of the rollable display 100, viewed from the outside, can be expanded.

In addition. The upper side of the reliable display 100, opened by the first opening 210 of the first slider 200, maintains a bent shape by the roller 230, and the upper side of the rollable display 100, opened by the second opening 310 of the second slider 300, maintains a bent shape by the curved shape maintaining portion 330.

That is, in a state that the rollable display 100 is rolled on the roller 230 and in a state that the rollable display 100 is unrolled from the roller 230, the rollable display 100 is opened by the first opening 210 of the first slider 200 and the second opening 310 of the second slider 300 such that the upper side of the rollable display 100, corresponding to the roller 230 and the curved shape maintaining portion 300, maintains the bent shape.

In addition, as the second sliding portion 320 of the second slider 300 slides together with the third sliding portion 420 of the third slider 400 into the first sliding portion 220 of the first slider 200, the first upper portion 221 of the first sliding portion 220. The second upper portion 321 of the second sliding portion 320, and the third upper portion 421 of the third sliding portion 420 support the rollable display 100.

That is, in the state that the rollable display 100 is rolled on the roller 230 and in the state that the rollable display 100 is unrolled from the roller 230, the rollable display 100 is supported by the first sliding portion 220, the second sliding portion 320, and the third sliding portion 420 such that the upper side of the rollable display 100, corresponding to the first sliding portion 220, the second sliding portion 320, and the third sliding portion 420 is substantially maintained to be flat.

In an embodiment, the first upper portion 221, the second upper portion 321, and the third upper portion 421 respectively have thin thicknesses compared to other portions of the first sliding portion 220, the second sliding portion 320, and the third sliding portion 420, and, therefore, the upper side of the rollable display 100, corresponding to the first sliding portion 220, the second sliding portion 320, and the third sliding portion 420 can be prevented or substantially prevented from being stepped.

In addition, the second end 120 of the rollable display 100 is bent and thus supported by the support 340, the printed circuit board 500 is disposed in the second sliding portion 320 of the second slider 300, the flexible printed circuit board 600 that is bent several times to connect between the second end 120 of the rollable display 100 and the printed circuit board 500 is supported by the curved shape maintaining portion 330, and the flexible printed circuit 600 can be prevented or substantially prevented from being interfered with by the support 340 by the reinforcing portion 350.

That is, in the state that the rollable display 100 is rolled on the roller 230 and in the state that the rollable display 100 is unrolled from the roller 230, the second end 120 of the rollable display 100 is supported by the second slider 300, the printed circuit board 500 is disposed in the second slider 300, the flexible printed circuit 600 is supported by the second slider 300 while connecting between the rollable display 100 and the printed circuit board 500, and the flexible printed circuit 600 is prevented or substantially prevented from being interfered with by the second slider 300, and accordingly, generation of interference in each of the rollable display 100, the printed circuit board 500, and the flexible printed circuit 600 can be suppressed.

As described above, when the rollable display 100 is rolled on the roller 230 or unrolled from the roller 230, stability of each of the rollable display 100, the printed circuit board 500, and the flexible printed circuit 600 of the rollable display device 1000 can be improved.

Figure 5:
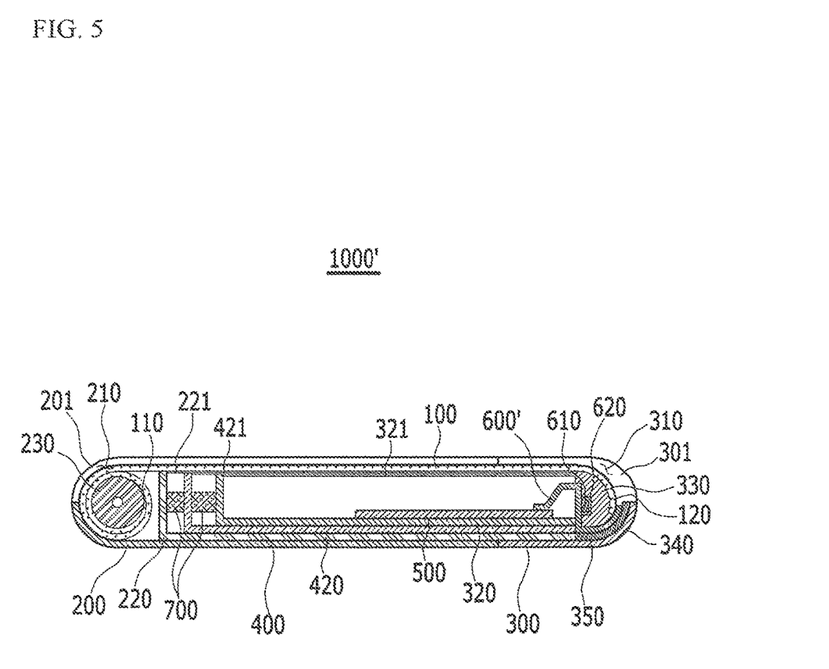
FIG. 5 is a cross-sectional view of a rollable display device according to another exemplary embodiment.

Referring to FIG. 5, a rollable display device according to another exemplary embodiment will be described. Herein, a description of portions that are different from those of the reliable display device 1000 according to the embodiment described above will be provided.

FIG. 5 is a cross-sectional view of a rollable display device according to another exemplary embodiment.

As shown in FIG. 5, a rollable display device 1000' according to another exemplary embodiment includes a rollable display 100, a first slider 200, a second slider 300, a third slider 400, a printed circuit board 500, a flexible printed circuit 600', and an elastic member 700.

The flexible printed circuit 600' is provided in a support 340. The flexible printed circuit 600' connects between the printed circuit board 500 and a second end of the rollable display 100. The flexible printed circuit 600' is bent several times in different directions to connect between the second end 120 of the rollable display 100 and the printed circuit board 500.

The support 340 includes a curved interior wall, and a reinforcing portion 350 is attached to the interior wall and the flexible printed circuit 600' is bent along the interior wall of the support 340.

In an embodiment, the reinforcing portion 350 is attached to the interior wall of the support 340 and the flexible printed circuit 600' is bent along the interior wall of the support 340 with the reinforcing portion therebetween such that the flexible printed circuit 600' can be suppressed from being interfered with by the support 340.

That is, in a state that the rollable display 100 is rolled on a roller 230 and in a state that the rollable display 100 is unrolled from the roller 230, the flexible printed circuit 600' can be suppressed from being interfered with by the support 340 such that generation of interference in the flexible printed circuit 600' can be suppressed.

As described above, when the rollable display 100 is rolled on the roller 230 or unrolled from the roller 230, stability of the flexible printed circuit 600' of the rollable display device 1000' can be improved.

Figure 6:
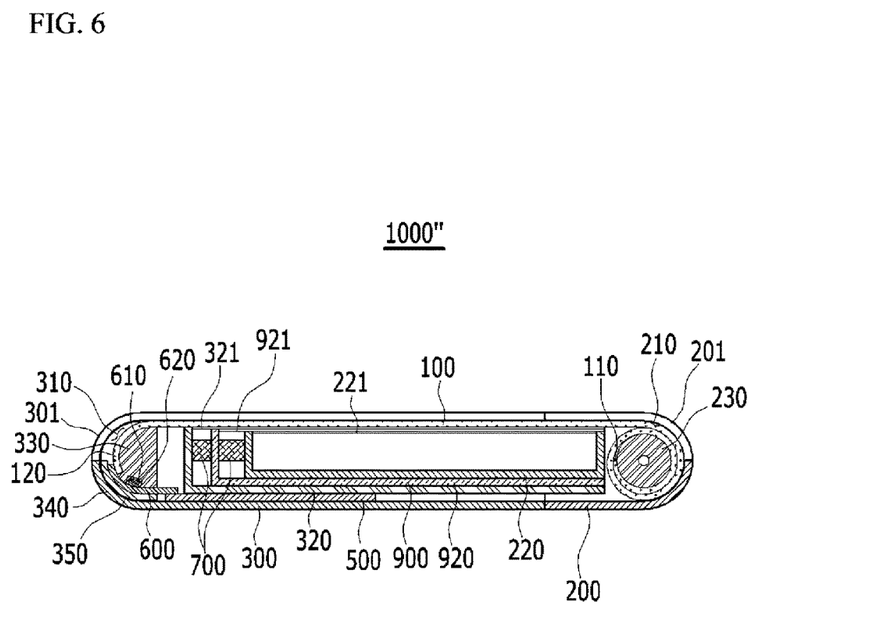
FIG. 6 is a cross-sectional view of a rollable display device according to another exemplary embodiment.

Referring to FIG. 6, a rollable display device according to another exemplary embodiment will be described. Herein, a description of portions that are different from those of the rollable display device according to the embodiment described above will be provided.

FIG. 6 is a cross-sectional view of a rollable display device according to another exemplary embodiment.

As shown in FIG. 6, a rollable display device 1000'' according to another exemplary embodiment includes a rollable display 100, a first slider 200, a second slider 300, a fourth slider 900, a printed circuit board 500, a flexible printed circuit 600, and an elastic member 700.

The rollable display 100 includes a first end 110 and a second end 120 that is disposed or spaced apart from the first end 110. The first end 110 of the rollable display 100 is supported by a roller 230 of the first slider 200, and the second end 120 of the rollable display 100 is supported by a support 340 of the second slider 300.

The first slider 200 is provided at a bottom side of the rollable display 100 and supports the bottom side of the rollable display 100. The first slider 200 slides against or relative to the fourth slider 900 and the second slider 300. The fourth slider 900 and the first slider 200 may slide into the second slider 300.

The first slider 200 includes a first opening 210, a first sliding portion 220, and the roller 230. The first sliding portion 220 includes a first upper portion 221, and slides into a second sliding portion 320 of the second slider 300.

The second slider 300 slides against or relative to the first slider 200. The first slider 200 may slide into the second slider 300. The printed circuit board 500 is disposed in the second slider 300, and the printed circuit board 500 is connected with the rollable display 100 through the flexible printed circuit 600. The second slider 300 includes a second opening 310, the second sliding portion 320, a curved shape maintaining portion 330, a support 340, and a reinforcing portion 350.

The second sliding portion 320 includes a second upper portion 321. The first sliding portion 220 may slide into the second sliding portion 320. The printed circuit board 500 is disposed at the outer side of the second sliding portion 320, and the printed circuit board 500 is connected with the rollable display 100 through the flexible printed circuit 600.

The fourth slider 900 connects between the first slider 200 and the second slider 300. In an embodiment, the fourth slider 900 slides into the second slider 300, and the first slider 200 slides into the fourth slider 900. That is, the first slider 200 may slide together with the fourth slider 900 into the second slider 300.

The fourth slider 900 includes a fourth sliding portion 920.

The fourth sliding portion 920 is provided at the bottom side of the rollable display 100 and supports the bottom side of the rollable display 100. The fourth sliding portion 920 is disposed between the first sliding portion 220 and the second sliding portion 320. The fourth sliding portion 920 includes a fourth upper portion 921 that opposes the bottom side of the rollable display 100. The fourth sliding portion 920 connects between the first sliding portion 220 and the second sliding portion 320. In an embodiment, the fourth sliding portion 920 slides into the second sliding portion 320, and the first sliding portion 220 slides into the fourth sliding portion 220. That is, the first sliding portion 220 may slide together with the fourth sliding portion 920 into the second sliding portion 320.

The printed circuit board 500 is disposed in a portion of the second slider 300 which is outside the second sliding portion 320.

The flexible printed circuit 600 is disposed in the support 340. The flexible printed circuit 600 is bent along the interior wall of the support 340 and connects between the second end 120 of the rollable display 100 and the printed circuit board 500.

The elastic member 700 is disposed between the first sliding portion 220 and the fourth sliding portion 920 and between the fourth sliding portion 920 and the second sliding portion 320. The elastic member 700 may generate an elastic force or elastic restoring force in a direction that the first sliding portion 220 and the fourth sliding portion 920 move away from each other and a direction that the fourth sliding portion 920 and the second sliding portion 320 move away from each other.

Herein, referring to FIG. 7, the rollable display 100 of the rollable display device 1000" in a state of being unrolled from the roller 230 will be described.

Figure 7:
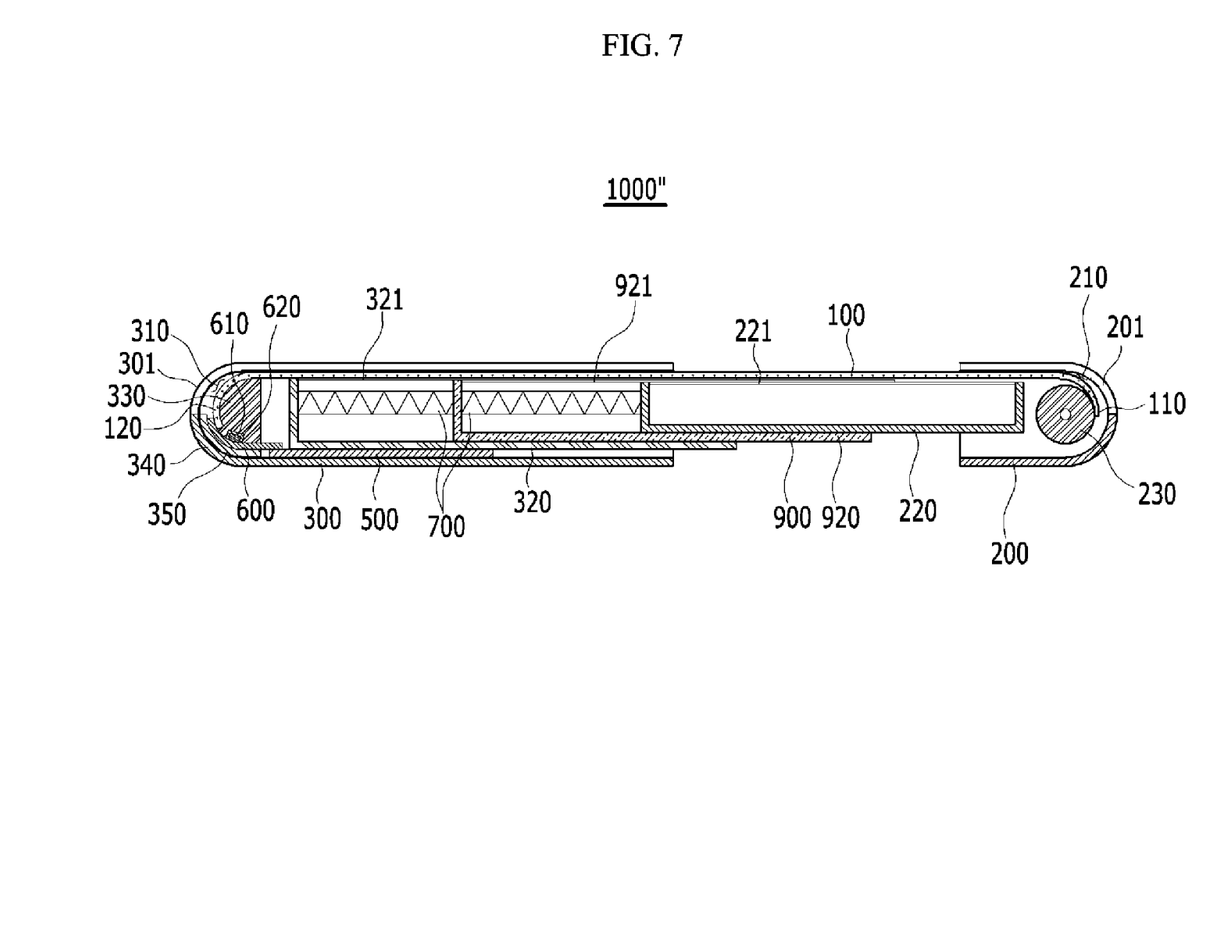
FIG. 7 is a cross-sectional view of the rollable display device of FIG. 6, shown in a state in which a rollable display of the rollable display device is unrolled from a roller.

FIG. 7 is a cross-sectional view of the rollable display device 1000" in which the rollable display 100 of FIG. 6 is unrolled from the roller 230.

As shown in FIG. 7, when the first slider 200 slides in a direction away from the second slider 300 together with the fourth slider 900 by the elastic force or elastic restoring force, the rollable display 100 is unrolled from the roller 230.

As the reliable display 100 is unrolled from the roller 230, a display area of the rollable display 100, viewed from the outside is expanded.

As the first sliding portion 220 of the first slider 200 slides into the second sliding portion 320 of the second slider 300 together with the fourth sliding portion 920 of the fourth slider 900, the first upper portion 221 of the first sliding portion 220, the second upper portion 321 of the second sliding portion 320, and the fourth upper portion 921 of the fourth sliding portion 920 support the rollable display 100.

That is, in a state that the rollable display 100 is rolled on the roller 230 and in a state that the rollable display 100 is unrolled from the roller 230, the rollable display 100 is supported by the first sliding portion 220, the second sliding portion 320, and the fourth sliding portion 920 such that the upper side of the rollable display 100, corresponding to the first sliding portion 220, the second sliding portion 320, and the fourth sliding portion 920, is substantially maintained to be flat.

In an embodiment, the first upper portion 221, the second upper portion 321, and the fourth upper portion 921 respectively have thin thicknesses compared to other portions of the first sliding portion 220, the second sliding portion 320, and the fourth sliding portion 920, and, therefore, the upper side of the rollable display 100, corresponding to the first sliding portion 220, the second sliding portion 320, and the fourth sliding portion 920, can be prevented or substantially prevented from being stepped.

In addition, the second end 120 of the rollable display 100 is bent and thus supported by the support 340, the printed circuit board 500 is disposed in the second slider 300, and the flexible printed circuit 600 that may be bent several times to connect the second end 120 of the rollable display 100 and the printed circuit board 500 is bent along the interior wall of the support 340 where the reinforcing portion 350 is provided such that the flexible printed circuit 600 can be prevented or substantially prevented from being interfered with by the support 340.

That is, in the state that the rollable display 100 is rolled on the roller 230 and in the state that the rollable display 100 is unrolled from the roller 230, the second end 120 of the rollable display 100 is supported by the second slider 300, the printed circuit board 500 is disposed in the second slider 300, the flexible printed circuit 600 is supported by the second slider 300 while connecting between the rollable display 100 and the printed circuit board 500, and the flexible printed circuit 600 is prevented or substantially prevented from being interfered with by the second slider 300, and, accordingly, generation of interference in each of the rollable display 100, the printed circuit board 500, and the flexible printed circuit 600 can be suppressed.

As described above, when the rollable display 100 is rolled on the roller 230 or unrolled from the roller 230, stability of each of the rollable display 100, the printed circuit board 500, and the flexible printed circuit 600 of the rollable display device 1000 can be improved.

While this disclosure has been described in connection with what are presently considered to be some practical example embodiments, it is to be understood that the present invention is not limited to the disclosed embodiments, but, on the contrary, is intended to cover various modifications and equivalent arrangements included within the spirit and scope of the appended claims,

What is claimed is:

1. A rollable display device comprising:
   a rollable display including a first end and a second end spaced apart from the first end;
   a first slider including a roller that supports the first end of the rollable display, the first slider being configured to roll the rollable display about the roller;
   a second slider including a support that supports the second end of the rollable display while bending the second end of the rollable display, the second slider being slideable relative to the first slider; and
   a flexible printed circuit comprising a first end connected to the second end of the rollable display, the flexible printed circuit extending away from the second end of the rollable display to a second end of the flexible printed circuit that is spaced apart from the rollable display, the flexible printed circuit being bent at an angle relative to the second end of the rollable display.

2. The rollable display device of claim 1, further comprising at least one elastic member between the first slider and the second slider.

3. The rollable display device of claim 1, further comprising:
   a printed circuit board arranged in the second slider and corresponding to a bottom side of the rollable display,
   wherein the flexible printed circuit is arranged in the support and connects between the printed circuit board and the second end of the rollable display.

4. The rollable display device of claim 3, wherein the second slider further comprises a reinforcing portion between the support and the flexible printed circuit.

5. The rollable display device of claim 3, wherein the first slider is slideable toward the second slider.

6. The rollable display device of claim 5, further comprising another slider between the first slider and the second slider,
   wherein the first slider is slideable toward the another slider, and the another slider is slideable toward the second slider.

7. The rollable display device of claim 3, wherein the second slider is slideable toward the first slider.

8. The rollable display device of claim 7, further comprising a third slider between the first slider and the second slider,
   wherein the second slider is slideable toward the third slider, and the third slider is slideable toward the first slider.

9. The rollable display device of claim 7, wherein the flexible printed circuit is bent in a plurality of directions.

10. The rollable display device of claim 7, wherein the flexible printed circuit is bent along an interior wall of the support.

11. A rollable display device comprising:
    a rollable display including a first end and a second end spaced apart from the first end;

a first slider including a roller that supports the first end of the rollable display, the first slider being configured to roll the rollable display about the roller;

a second slider including a support that supports the second end of the rollable display while bending the second end of the rollable display, the second slider being slideable relative to the first slider;

a printed circuit board arranged in the second slider and corresponding to a bottom side of the rollable display; and a flexible printed circuit arranged in the support and connecting between the printed circuit board and the second end of the rollable display, wherein the flexible printed circuit comprises:

a chip opposing the bottom side of the rollable display; and a heat dissipating portion surrounding the chip.

12. A rollable display device comprising:

a rollable display including a first end and a second end spaced apart from the first end;

a first slider including a roller that supports the first end of the rollable display, the first slider being configured to roll the rollable display about the roller;

a second slider including a support that supports the second end of the rollable display while bending the second end of the rollable display, the second slider being slideable relative to the first slider;

a printed circuit board arranged in the second slider and corresponding to a bottom side of the rollable display; and a flexible printed circuit arranged in the support and connecting between the printed circuit board and the second end of the rollable display, wherein the first slider is slideable toward the second slider, and wherein the flexible printed circuit is bent along an interior wall of the support.

13. A rollable display device comprising:

a rollable display including a first end and a second end spaced apart from the first end;

a first slider including a roller that supports the first end of the rollable display, the first slider being configured to roll the rollable display about the roller; and a second slider including a support that supports the second end of the rollable display while bending the second end of the rollable display, the second slider being slideable relative to the first slider, wherein the support comprises a curved interior wall.

* * * * *